(12) United States Patent
Alva et al.

(10) Patent No.: US 11,940,851 B2
(45) Date of Patent: Mar. 26, 2024

(54) HINGE MECHANISM FOR FOLDABLE DEVICES WITH FLEXIBLE DISPLAYS

(71) Applicant: Intel Corporation, Santa Clara, CA (US)

(72) Inventors: Samarth Alva, Bangalore (IN); Yogesh Channaiah, Mandya (IN)

(73) Assignee: Intel Corporation, Santa Clara, CA (US)

(*) Notice: Subject to any disclaimer, the term of this patent is extended or adjusted under 35 U.S.C. 154(b) by 667 days.

(21) Appl. No.: 17/033,736

(22) Filed: Sep. 26, 2020

(65) Prior Publication Data
US 2021/0011527 A1    Jan. 14, 2021

(51) Int. Cl.
G06F 1/16 (2006.01)
H04M 1/02 (2006.01)
H05K 5/02 (2006.01)
H05K 5/03 (2006.01)

(52) U.S. Cl.
CPC .......... *G06F 1/1681* (2013.01); *G06F 1/1618* (2013.01); *G06F 1/1647* (2013.01); *H04M 1/0268* (2013.01); *H05K 5/0226* (2013.01); *H05K 5/03* (2013.01); *G06F 2200/1612* (2013.01)

(58) Field of Classification Search
CPC .... G06F 1/1618; G06F 1/1647; G06F 1/1652; G06F 1/1681
See application file for complete search history.

(56) References Cited

U.S. PATENT DOCUMENTS

| | | | |
|---|---|---|---|
| 9,348,450 B1* | 5/2016 | Kim | H04M 1/0268 |
| 9,524,000 B2* | 12/2016 | Hsu | G06F 1/1681 |
| 9,541,962 B2* | 1/2017 | Siddiqui | G06F 1/1618 |
| 9,677,308 B1* | 6/2017 | Chen | E05D 3/18 |
| 10,281,951 B2* | 5/2019 | Vic | E05D 3/06 |
| 10,551,880 B1* | 2/2020 | Ai | G06F 1/1641 |
| 11,073,863 B2* | 7/2021 | Kim | H04M 1/0216 |
| 11,223,710 B2* | 1/2022 | Cheng | H04M 1/0268 |
| 11,372,452 B2* | 6/2022 | Kim | G06F 1/1681 |

(Continued)

FOREIGN PATENT DOCUMENTS

WO  2019173118 A1  9/2019

OTHER PUBLICATIONS

Padla, Rei; "Samsung Galaxy Fold disassembly shows foldable, hinge mechanism," article accessed on the internet at https://androidcommunity.com/samsung-galaxy-fold-disassembly-shows-foldable-hinge-mechanism-20190419/; Android Community; Apr. 19, 2019; 3 pages.

(Continued)

*Primary Examiner* — Adrian S Wilson
(74) *Attorney, Agent, or Firm* — Alliance IP, LLC

(57) ABSTRACT

In one embodiment, a hinge apparatus includes two curved rack apparatuses, each curved rack apparatus defining an arcuate surface and an arcuate set of gear teeth concentric with the arcuate surface, where the radius of curvature of the arcuate set of gear teeth being non-uniform. The hinge apparatus further includes a gear assembly that includes a first gear, a second gear, a third gear coupling the first and second gears, a fourth gear coupling the first gear and the arcuate set of gear teeth of the first curved rack apparatus, and a fifth gear coupling the second gear and the arcuate set of gear teeth of the second curved rack apparatus.

20 Claims, 12 Drawing Sheets

(56) References Cited

U.S. PATENT DOCUMENTS

| | | | |
|---|---|---|---|
| 11,467,631 B2* | 10/2022 | Park | G06F 1/1681 |
| 11,474,570 B2* | 10/2022 | Lee | G06F 1/1652 |
| 11,609,606 B2* | 3/2023 | Myeong | G06F 1/1681 |
| 11,625,074 B2* | 4/2023 | Moon | H04M 1/022 |
| | | | 361/679.27 |
| 2012/0307423 A1* | 12/2012 | Bohn | H04M 1/0216 |
| | | | 361/679.01 |
| 2014/0111954 A1* | 4/2014 | Lee | H04M 1/0268 |
| | | | 361/749 |
| 2015/0047152 A1* | 2/2015 | Cheng | G06F 1/1618 |
| | | | 16/354 |
| 2015/0159413 A1* | 6/2015 | Chen | G06F 1/1681 |
| | | | 16/342 |
| 2015/0233162 A1* | 8/2015 | Lee | G06F 1/1641 |
| | | | 16/223 |
| 2016/0085265 A1* | 3/2016 | Park | H04M 1/0268 |
| | | | 361/807 |
| 2016/0097227 A1* | 4/2016 | Hsu | G06F 1/1681 |
| | | | 16/354 |
| 2016/0109908 A1* | 4/2016 | Siddiqui | G06F 1/1681 |
| | | | 16/225 |
| 2019/0166703 A1 | 5/2019 | Kim et al. | |
| 2019/0390703 A1* | 12/2019 | Hsu | F16C 11/04 |
| 2020/0137907 A1* | 4/2020 | Kang | H05K 5/0017 |

OTHER PUBLICATIONS

EPO; Extended European Search Report issued in EP Patent Application No. 21193294.2, dated Feb. 11, 2022; 11 pages.

* cited by examiner

HINGE MECHANISM FOR FOLDABLE DEVICES WITH FLEXIBLE DISPLAYS

TECHNICAL FIELD

This disclosure relates in general to the field of computer systems and, more particularly, to a hinge mechanism for foldable devices with flexible displays.

BACKGROUND

Flexible displays may allow for the creation of innovating form factors, bringing new usages for end users. Current foldable hinge designs may enable the folding and unfolding of these flexible displays. There are many design challenges with integrating foldable displays into devices, including the panel mounting and hinge design for reliable panel operation over the device life. Integrating the panel with the hinge design is one example challenge. A typical hinge design with a fixed pivoting axis does not allow the arc length of the foldable display to be maintained while closing and opening, which may damage the display or cause other issues for the display.

BRIEF DESCRIPTION OF THE DRAWINGS

Like reference numbers and designations in the various drawings indicate like elements.

DETAILED DESCRIPTION OF EXAMPLE EMBODIMENTS

Figure 1A:
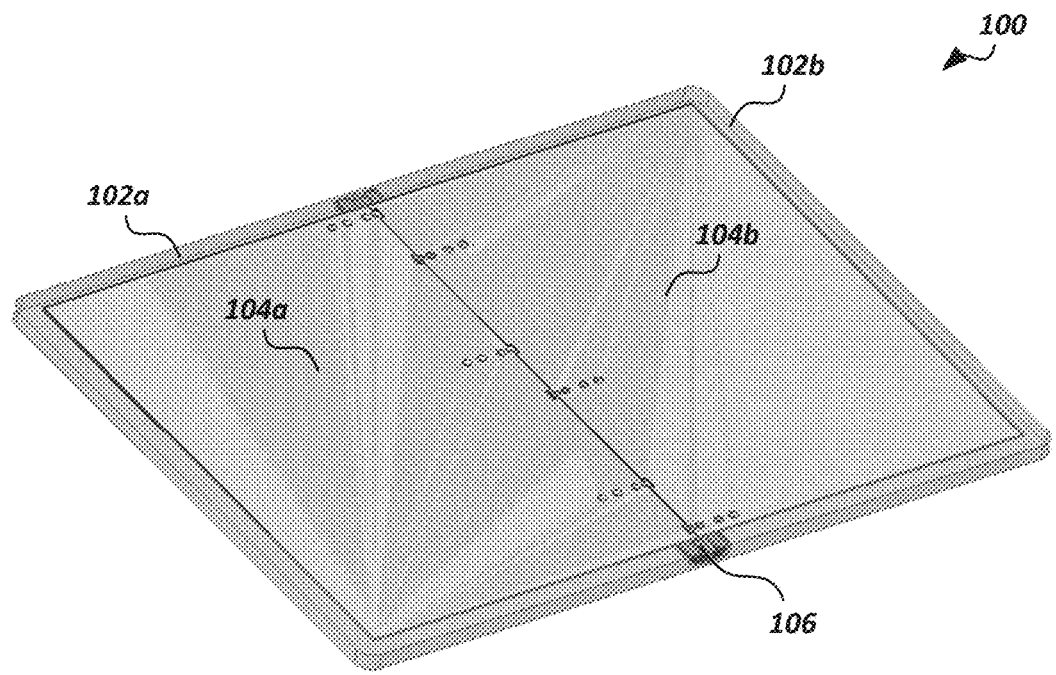
FIGS. 1A-1C illustrate views of an example foldable computing device that may incorporate a flexible display.

In the following description, numerous specific details are set forth, such as examples of specific configurations, structures, architectural details, etc. in order to provide a thorough understanding of the present disclosure. It will be apparent, however, to one skilled in the art that these specific details need not be employed to practice embodiments of the present disclosure. In some instances, well known components or methods may be utilized, and such details haven't been described in detail in order to avoid unnecessarily obscuring embodiments of the present disclosure.

Flexible displays may allow for the creation of innovating form factors, bringing new usages for end users. Existing foldable hinge designs may enable the folding and unfolding of these flexible displays. There are many design challenges with integrating foldable displays into devices, including the panel mounting and hinge design for reliable panel operation over the device life. Integrating the panel with the hinge design is one example challenge. A typical hinge design with a fixed pivoting axis does not allow the arc length of the foldable display to be maintained while closing and opening, which may damage the display or cause other issues for the display.

Existing hinge designs may exhibit one or more of the following disadvantages: a lot of moving parts and precise components that can end up jamming or wearing out of the mechanism, thus causing damage to the flexible display; "backlash" between the gears may be present; the weight of the foldable display mechanism can be quite high (e.g., ~25% of the product weight itself); or may have small gaps or opening through which foreign material/particles/debris can enter and damage the mechanism.

Accordingly, embodiments disclosed herein may include a robust hinge design for a foldable computing system that provides one or more advantages over existing hinge designs. For example, in some cases, a hinge design as described herein may eliminate or reduce the unwanted stress on the flexible display (e.g., flexible organic light emitting diode (FOLED)-based display) during opening, closing, and usage of the computing system. As another example, in some cases, a hinge design as described herein may prevent the entry of foreign particles or debris into parts of the computing system. As yet another example, in some cases, a hinge design as described herein may provide support to the flexible display (e.g., for systems with a higher bend radius). As yet another example, in some cases, a hinge mechanism as described herein may provide modularity and easy serviceability (e.g., when replacing the hinge) without the need for the flexible display to be accessed or removed, which is lacking in current designs.

In particular embodiments, for instance, a synchronous, low backlash, multi-gear driven hinge mechanism may be utilized. The hinge mechanism may include a unique opening trajectory that respects the folding & unfolding curve for a given bend radius of the flexible display. In some cases, a protection layer of low energy material may be incorporated at or near the bend area of the flexible display to prevent fatigue or other issues. In some embodiments, ingress protection may be included for prevention of debris and foreign particles into the hinge mechanism or other internal components. In some embodiments, e.g., foldable computing systems with higher bend radii, a support mechanism may be included that can support the display all the way from a lay-flat mode (180°) to a "laptop mode" (~90°) (e.g., for workflows that require touching at or near the bend of the screen). Further, in some embodiments, the bend radius of the foldable device may be as small as 1 mm.

Figure 1B:
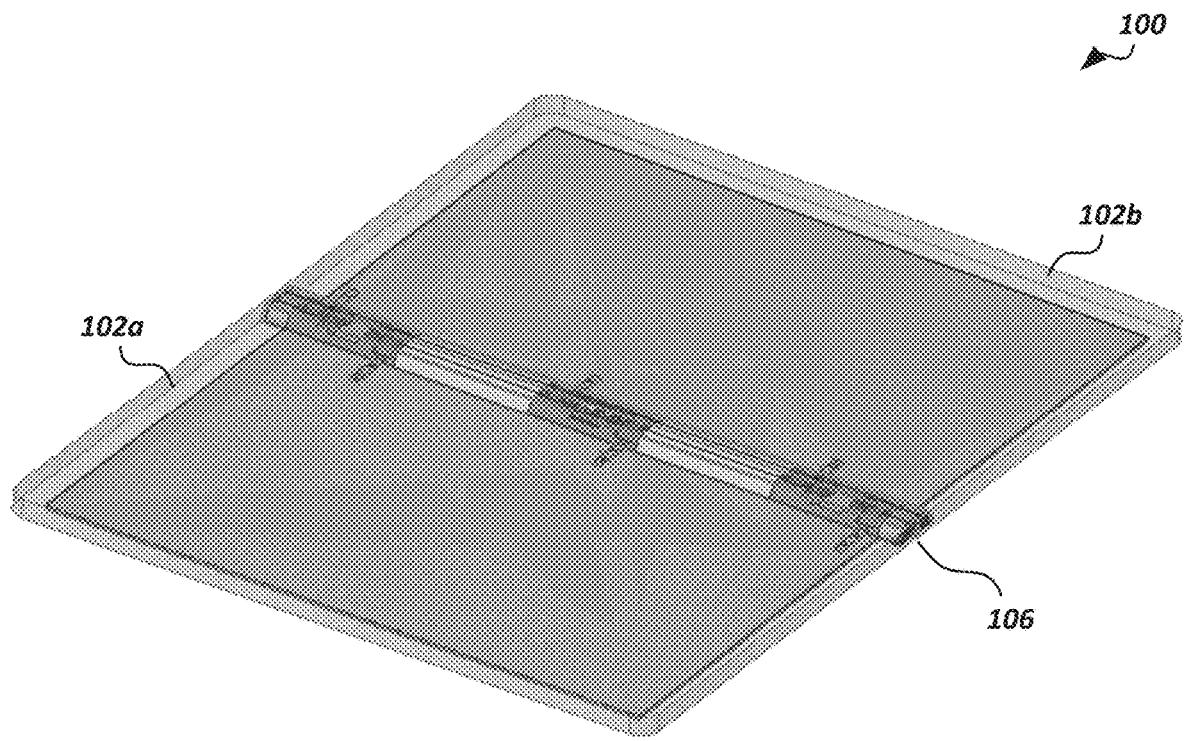
Figure 1C:
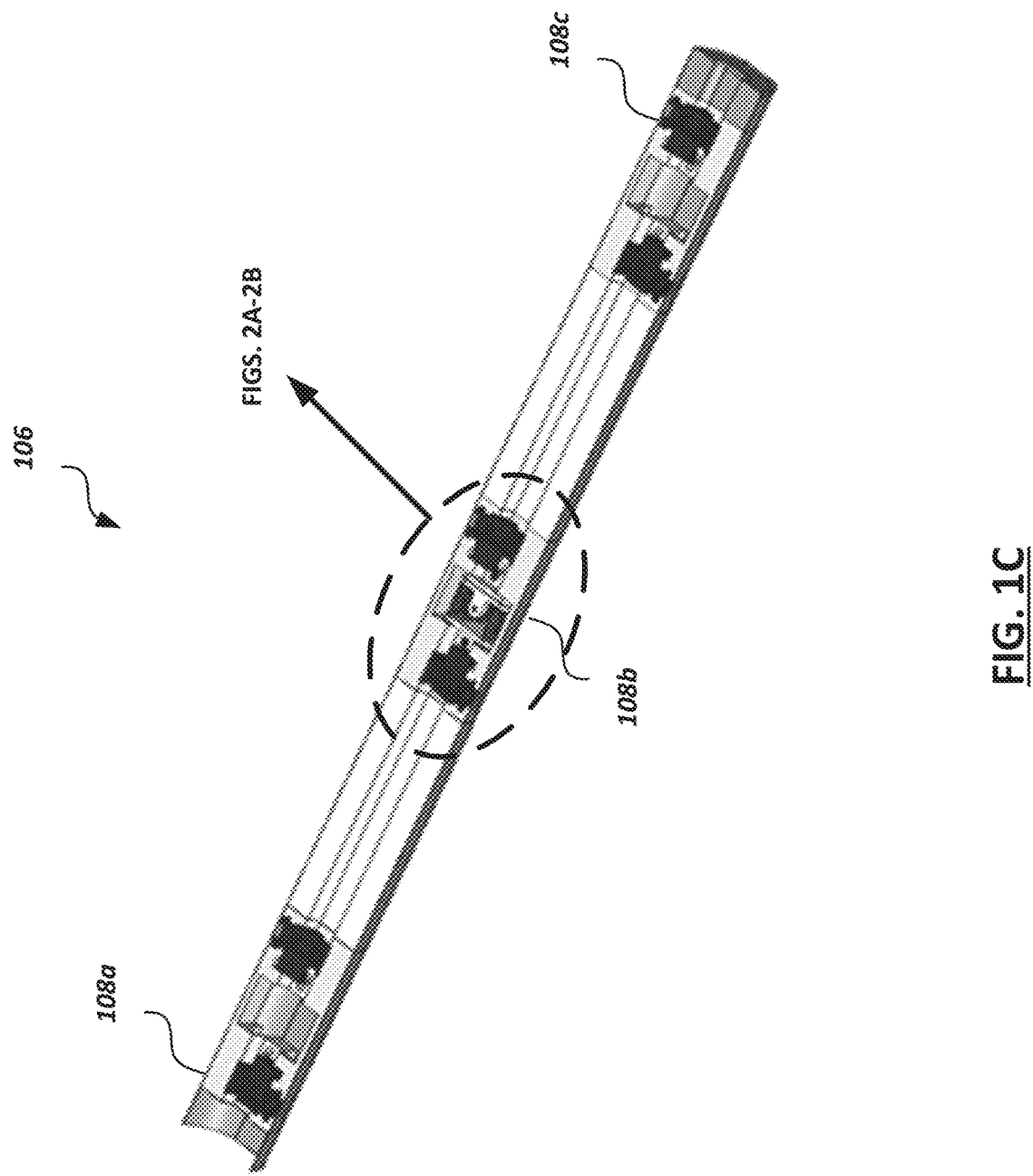

FIGS. 1A-1C illustrate views of an example foldable computing device 100 that may incorporate a flexible display. The example foldable computing device 100 includes two device housings 102 and two flat display support panels 104 that are coupled together via the spine 106. In certain embodiments, computer device components (e.g., those shown in FIGS. 7-8) maybe housed within one or both of the device housings 102, and a foldable display (e.g., FOLED) may be coupled to the flat display support panels 104. The spine 106 includes multiple hinge mechanisms 108 to allow the device 100 to fold. In the example shown, the device 100 includes a hinge mechanism 108b that includes a gear assembly (e.g., a crossed-helical gear assembly), and two other hinge mechanisms 108a, 108c that do not include gear assemblies. The hinge mechanism 108b may be similar to the example mechanism 200 of FIGS. 2A-2B and described further below, while the hinge mechanism 108b may be similar to the example mechanism 200 but without the gear assembly (i.e., the curved rack apparatuses in each of the mechanisms 108 may be shaped in the same way). Although a particular number and arrangement of hinge mechanisms are shown in FIG. 1, embodiments of may include any suitable number of hinge mechanisms in any suitable arrangement, and any number of the included hinge mechanisms may include a gear assembly.

Figure 2A:
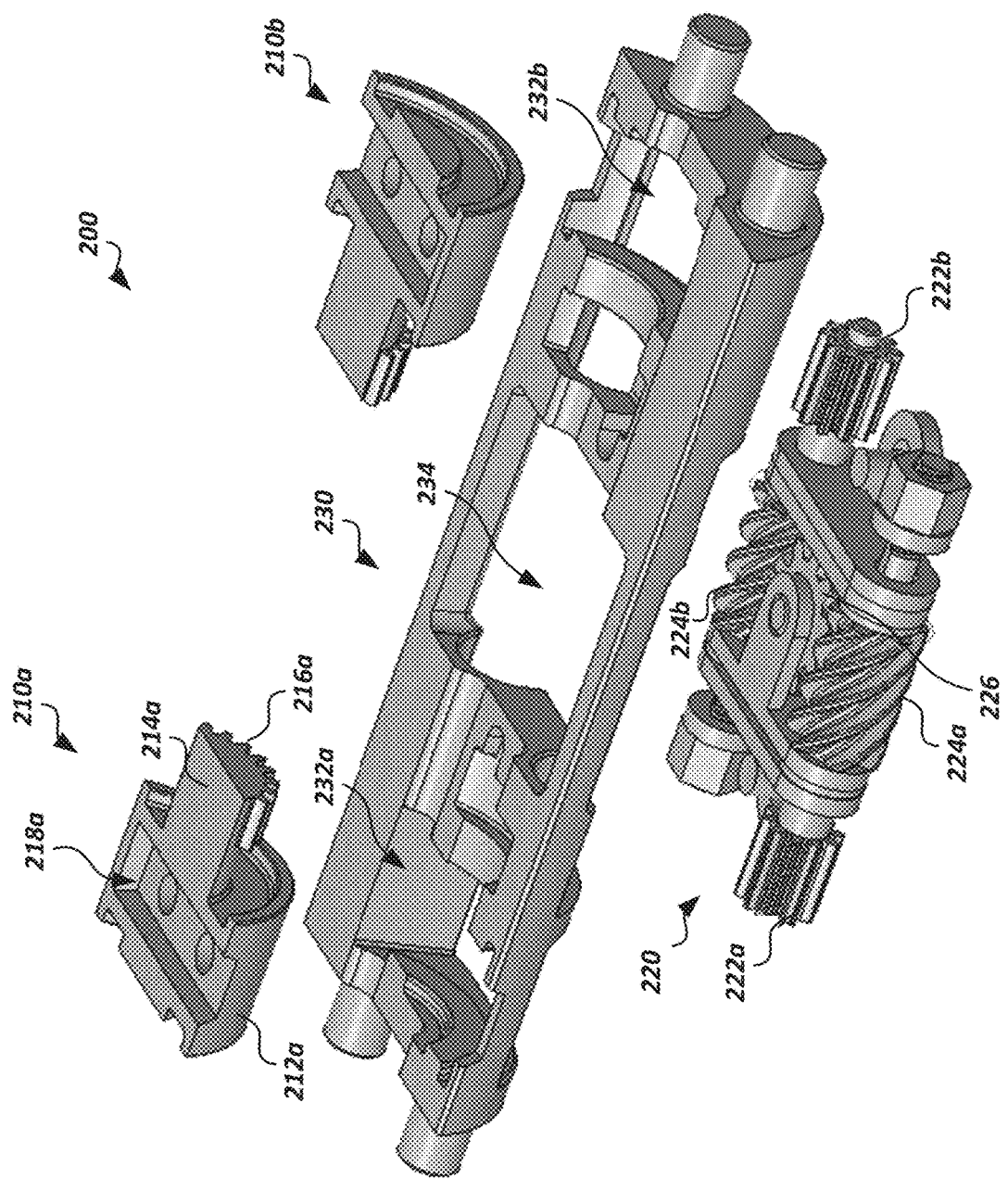
FIGS. 2A-2B illustrate example views of a hinge mechanism that may be incorporated into a foldable computing device with a flexible display.
Figure 2B:
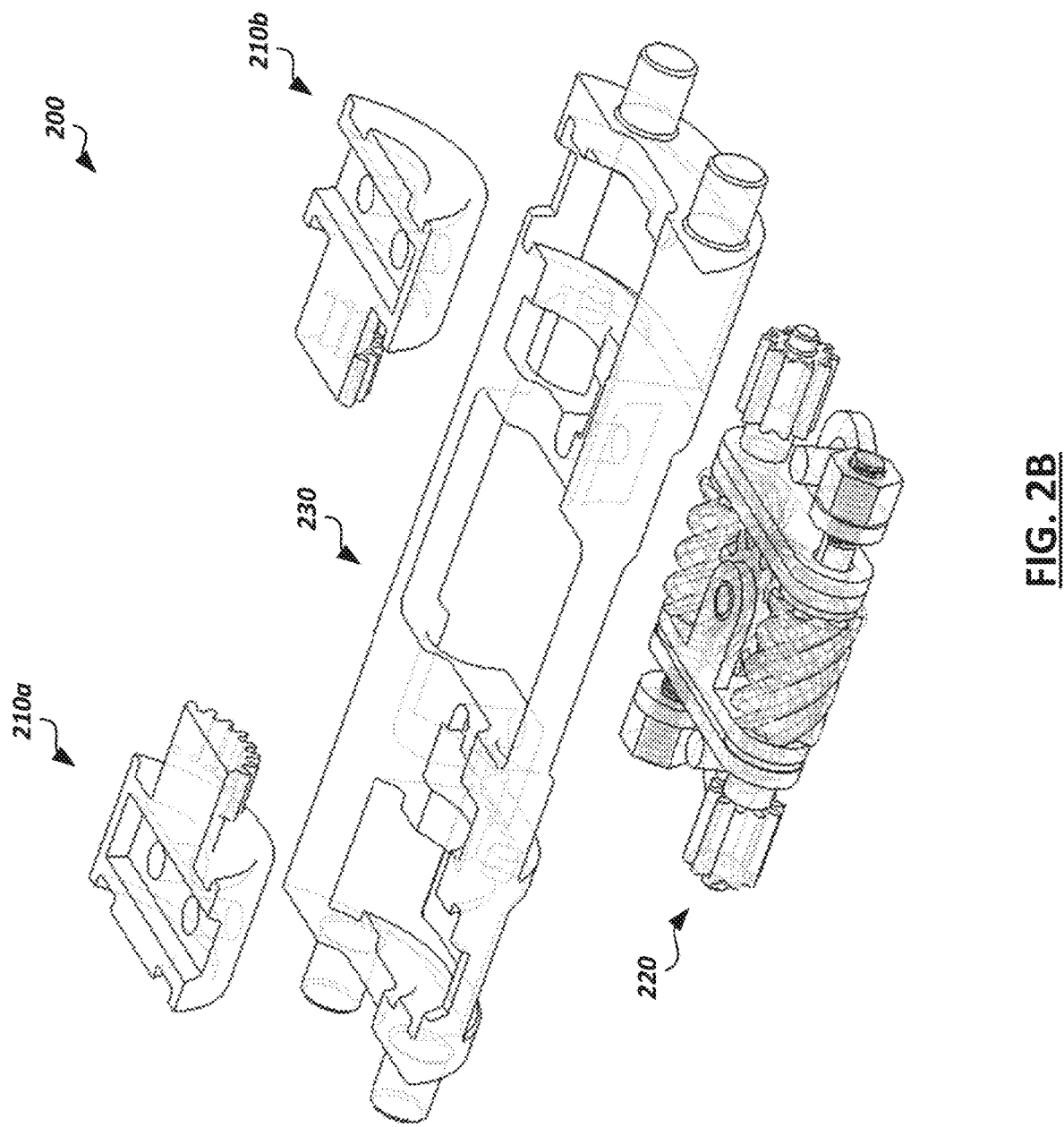

FIGS. 2A-2B illustrate example views of a hinge mechanism 200 that may be incorporated into a foldable computing device with a flexible display. In particular, FIG. 2A illustrates the example hinge mechanism 200 in solid form, while FIG. 2B illustrates the example hinge mechanism 200 in wireline form.

The example hinge mechanism 200 includes a central housing 230. The housing 230 defines a cavity 234 in which a low backlash synchronous gear assembly 220 may be housed. The housing 230 further defines cavities 232 in which curved rack apparatuses 210 may be housed. The curved rack apparatuses may be designed to couple to respective support plates for a flexible display (e.g., support panels 104). The curved rack apparatuses 210 may include a uniquely curved arcuate surface 212 that forces rotation in a way that always ensures that an overall arc length of the flexible display is maintained throughout the range of motion (e.g., going from lay-flat to a folded state). The gear assembly 220 is designed that the curved rack apparatuses 210 may rotate synchronously with a varying pivot or position for every small step angle. To achieve the synchronous movement, the gear assembly 220 may utilize a set of crossed helical gears, which may allow for smooth and noise free operation.

The example curved rack apparatuses 210 each define an arcuate surface 214 having a non-uniform radius of curvature. The surface 214 connects to the surface 212, which includes at least one substantially flat portion (e.g., for flush mating with a support panel such as panel 104). The curvature of the arcuate surface 212 is defined such that an overall arc length of a flexible display remains the same throughout the folding range of a device. One way of determining the curvature of the arcuate surface 212 is described further below with respect to FIG. 3. Each curved rack apparatus 210 further defines an arcuate set of gear teeth 216 that may interact with the gears 222 of the gear assembly 220. The arcuate set of gear teeth 216 are concentric with the arcuate surface 212 and have a non-uniform radius of curvature, which may be similar to the curvature of the arcuate surface 212. That is, the origin of the curvature for both the set of gear teeth 216 and the arcuate surface 212 is the same.

Each curved rack apparatus 210 further defines a portion 218 for coupling the curved rack apparatus 210 to a display support panel (e.g., screw holes or other type of attachment mechanism to couple the apparatus 210 to a support panel such as panel 104). The curved rack apparatus 210 and display support panel may be coupled together in any suitable manner, such as, for example, using adhesives, screws, or other attachment means. The curved rack apparatuses 210 may be disposed in their respective housing cavities 232 such that the surfaces 212 are in contact with an inner surface of the housing cavities 232.

The example gear assembly 220 includes two spur gears 222 that couple to the arcuate set of gear teeth 216 of the curved rack apparatuses 210. The spur gears 222 are coupled to helical gears 224. The spur gears 222 and helical gears 224 are in-line with one another (i.e., the rotational axis of 222a and 224a are the same, and rotational axis of 222b and 224b are the same), while the helical gears 224a, 224b have rotational axes that are offset from one another. The helical gears 224a, 224b are coupled to one another via another helical gear 226, which has a lower helix angle than the helical gears 224. The example gear assembly 220 may allow for synchronous, low backlash operation.

Figure 3:
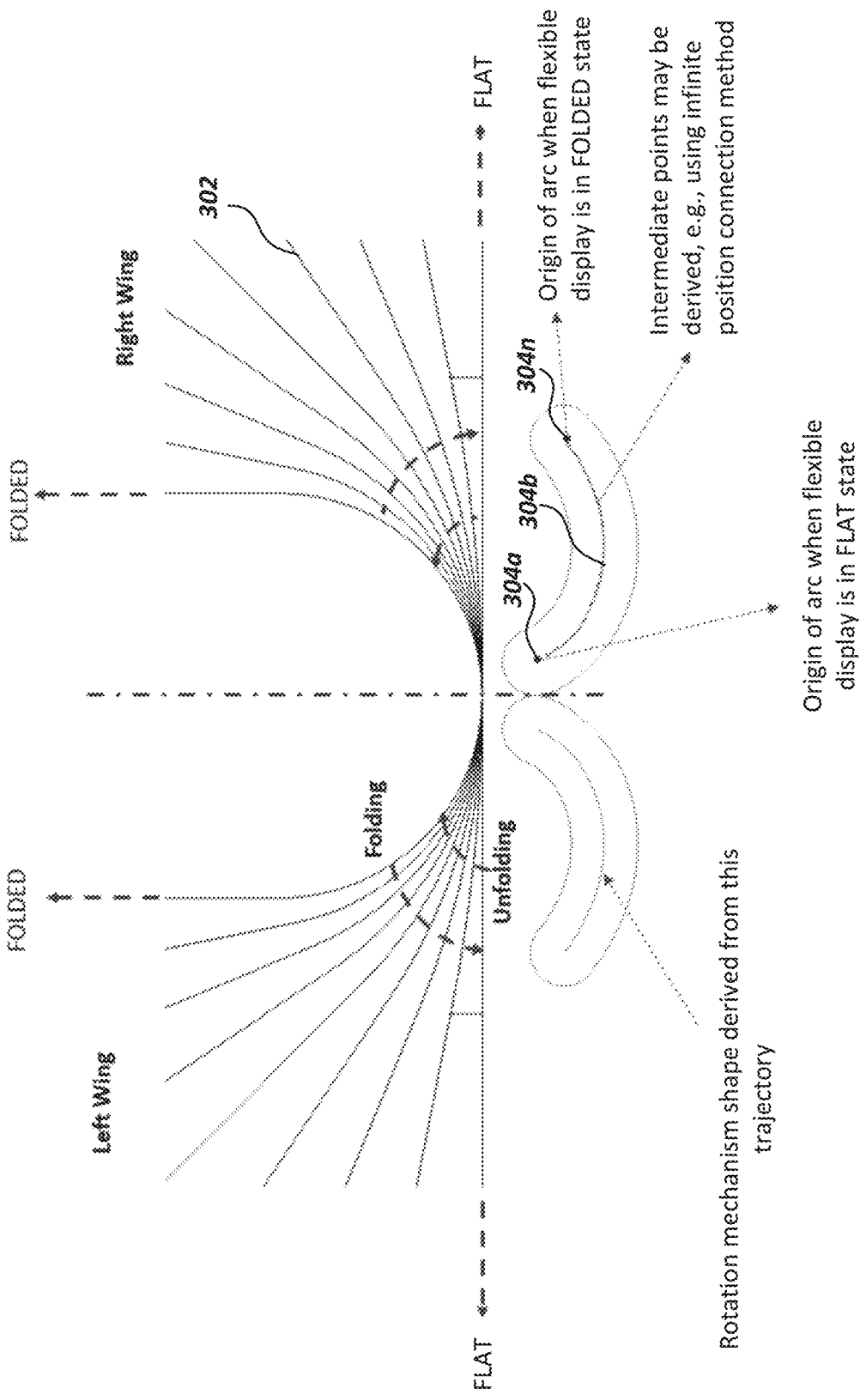
FIG. 3 illustrates a principle of operation for the example hinge mechanism of FIGS. 2A-2B.

FIG. 3 illustrates a principle of operation for the example hinge mechanism 200 of FIGS. 2A-2B. In particular, FIG. 3 illustrates a way that the arc length of a flexible display 302 changes as the display is moved between the flat and folded states. In addition, FIG. 3 illustrates how the origin 304 of the arc moves as the display is moved between the flat and folded states. The trajectory of the origin as it moves between 302a and 302n may dictate the shape of the curved rack apparatus 210 (e.g., the curvature of the surface 212) of the hinge mechanism 200. It will be noted that the trajectory of the origin forms a curvature that has a non-uniform radius. By forming the curved rack apparatus 210 according to this trajectory, the hinge mechanism 200 may maintain a constant arc length for the flexible display throughout the range of motion between the folded and flat states.

Figure 4:
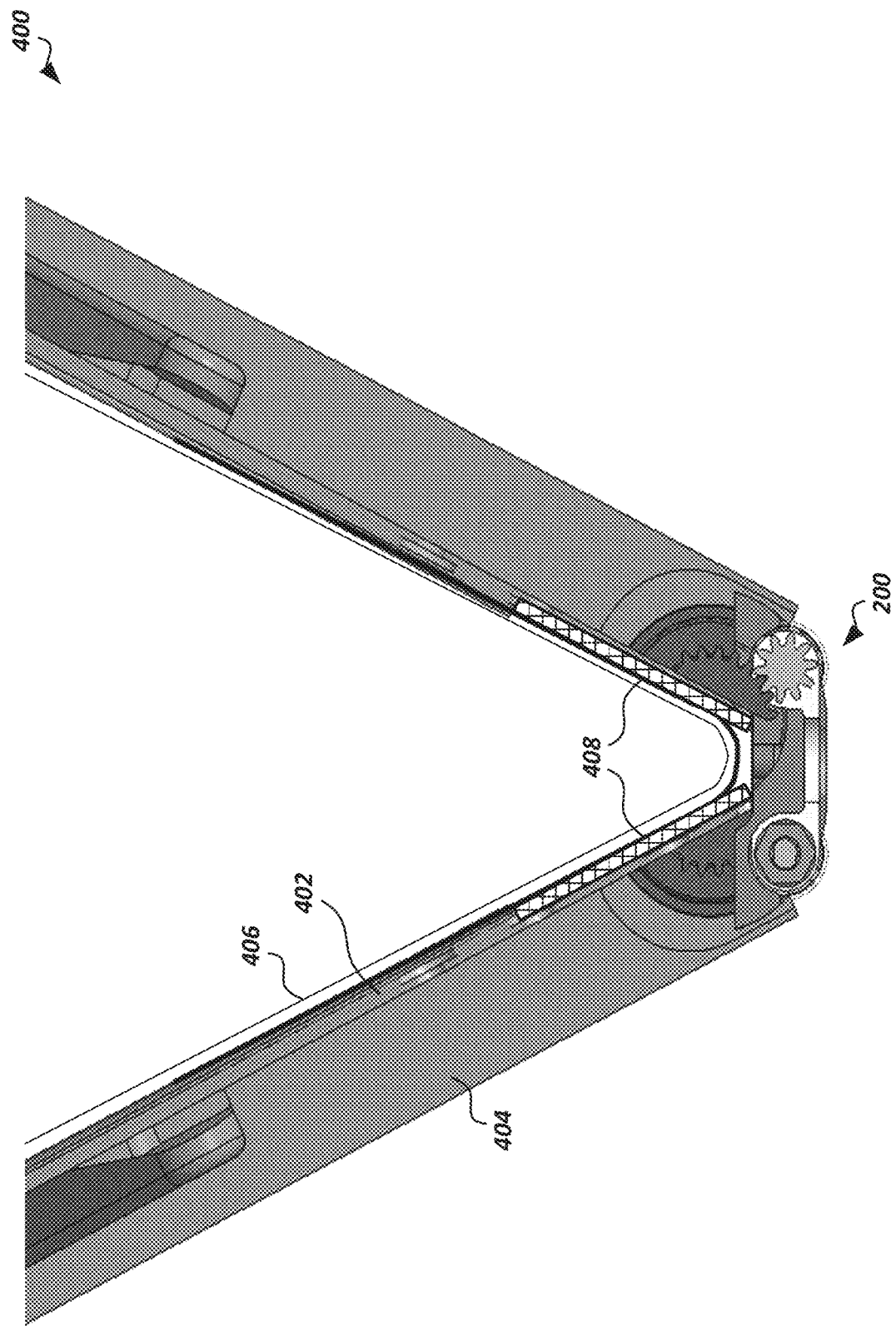
FIG. 4 illustrates a side view of an example foldable device that incorporates the hinge mechanism of FIGS. 2A-2B.

FIG. 4 illustrates a side view of an example foldable device 400 that incorporates the hinge mechanism 200 of FIGS. 2A-2B. The example device 400 includes two flat display support panels 402 coupled to the hinge mechanism 200 (e.g., via the curved rack apparatuses 210), and two device housings 404 that are each respectively coupled to one of the display support panels 402. The device 400 further includes a flexible display 406 coupled to the display support panels 402 (on a surface opposite the surface to which the mechanism 200 is coupled).

In certain embodiments, to ensure that the flexible display 406 is well protected, a release liner material 408 with low surface energy may be positioned between the support plate 402 and the display 406 (e.g., on an end of the support plate 402 that is near the folding axis, as shown in FIG. 4). The liner material 408 may allow adhesion-free separation between the support plate 402 and the flexible display 406 at and near the bend area as shown in FIG. 4. In some embodiments, the liner material 408 may be a low surface energy material, such as PET. A low surface energy material may refer to a material having a surface energy less than 50 dynes/cm (e.g., between approximately 18-38 dynes/cm).

Figure 5A:
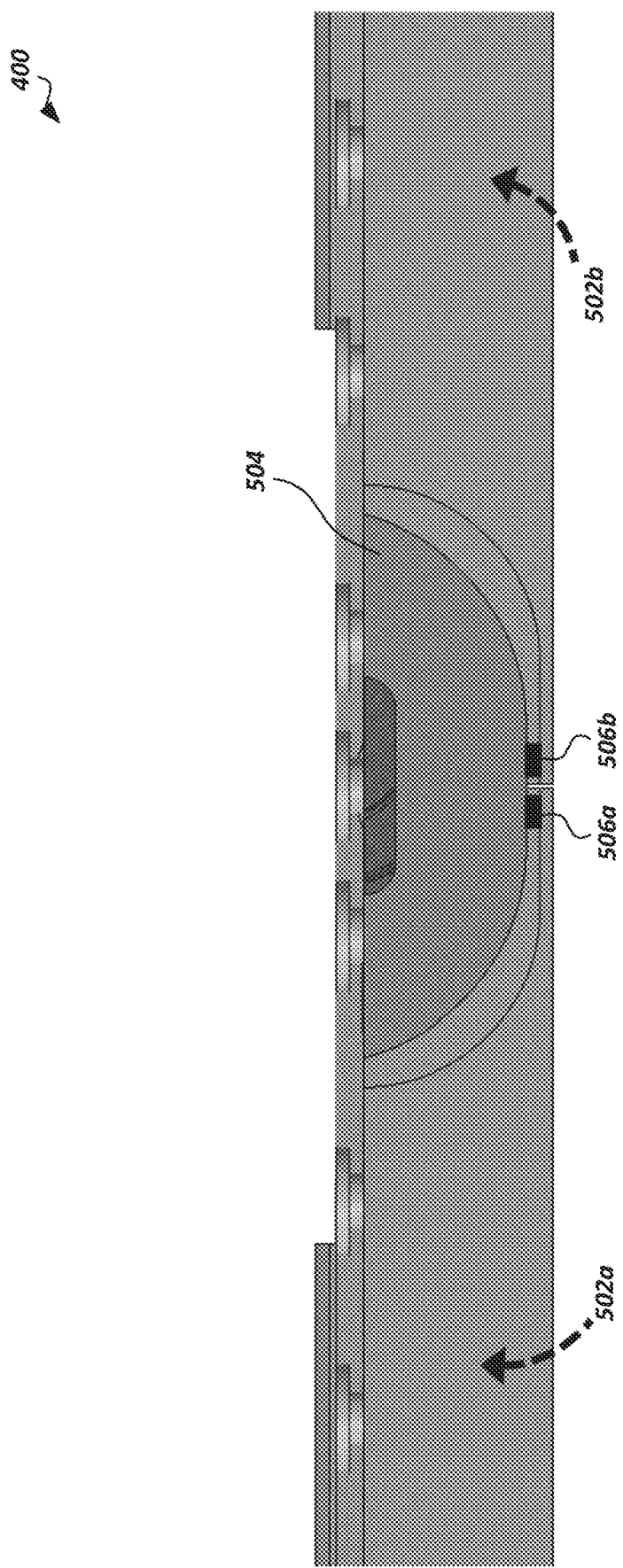
FIGS. 5A-5C illustrate side views of another example foldable device that incorporates the hinge mechanism of FIGS. 2A-2B.
Figure 5B:
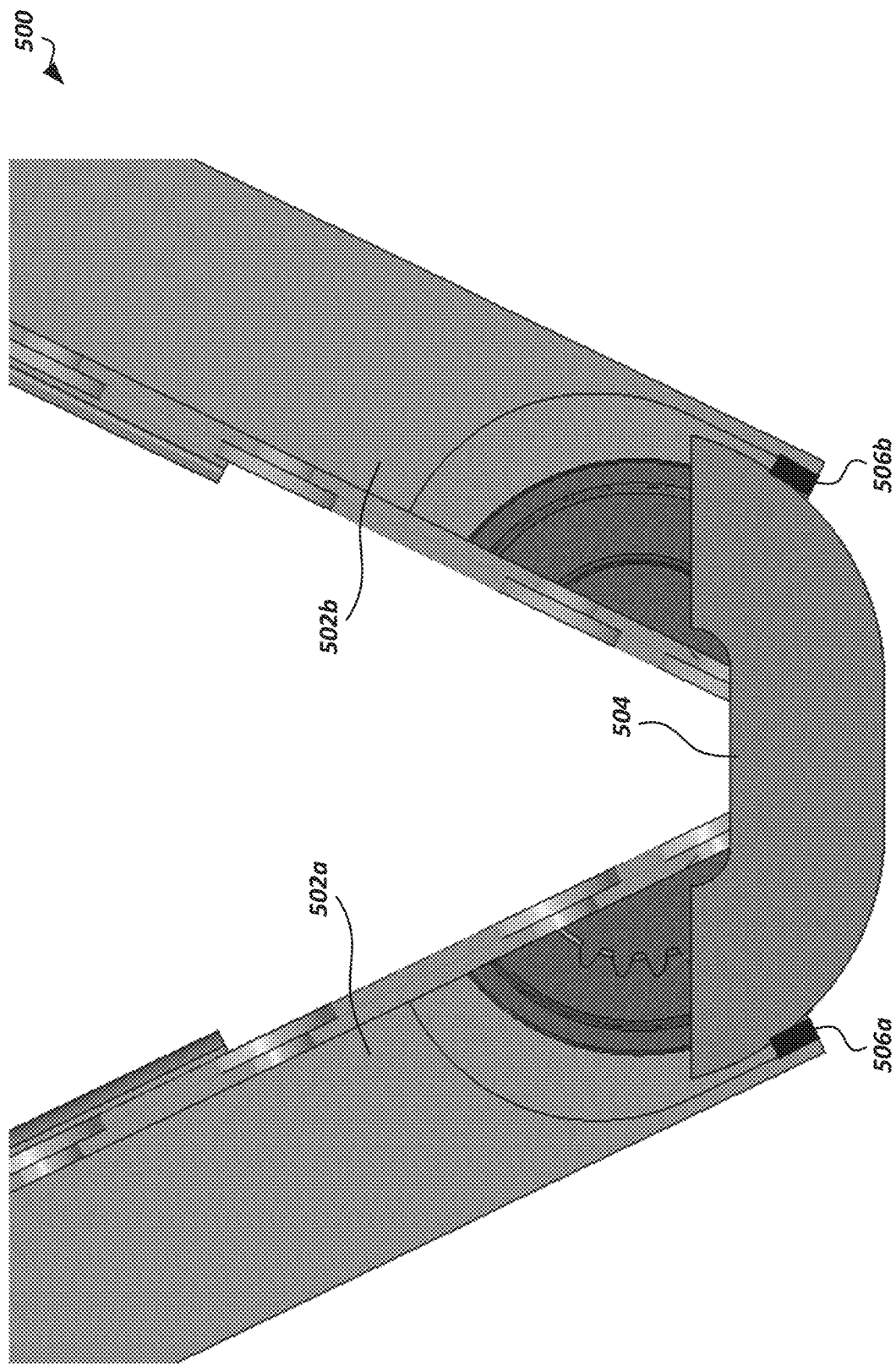
Figure 5C:
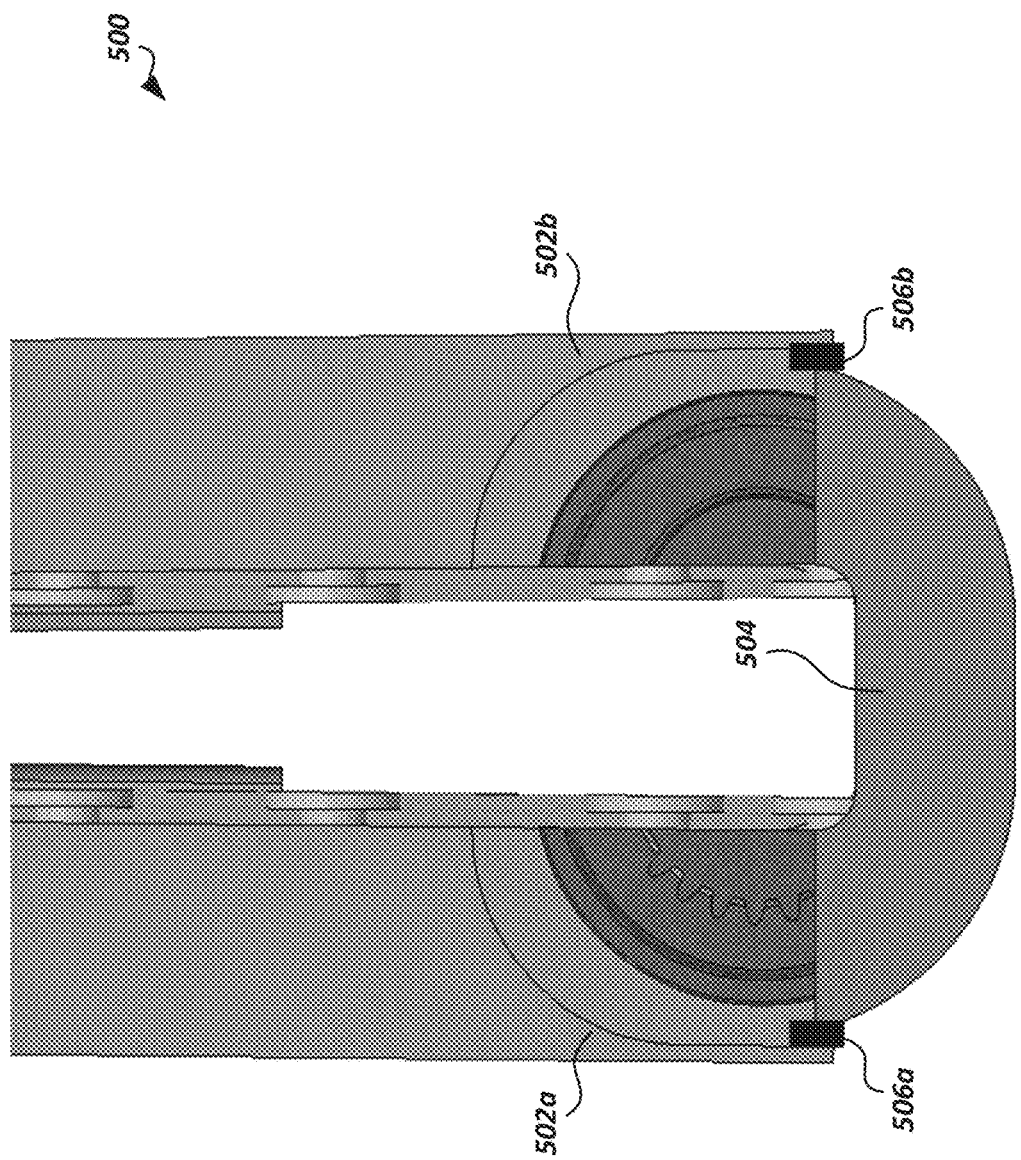

FIGS. 5A-5C illustrate side views of another example foldable device 500 that incorporates the hinge mechanism 200 of FIGS. 2A-2B. In the examples shown, the device 500 includes ingress protection features 506 to ensure that foreign particles and debris do not enter into the device, preventing potential jamming of the hinge mechanism 504 and potential damage to a flexible display of the device. The ingress protection features 506 may include a diaphragm material, such as, for example Teflon-coated rubber. The ingress protection features 506 may be disposed between the hinge mechanism 504 and the device housing 502 of the device 500 as shown. The ingress protection features 506 may accordingly prevent ingress of foreign particles into the hinge mechanism 504 or the device housing 502.

Figure 6:
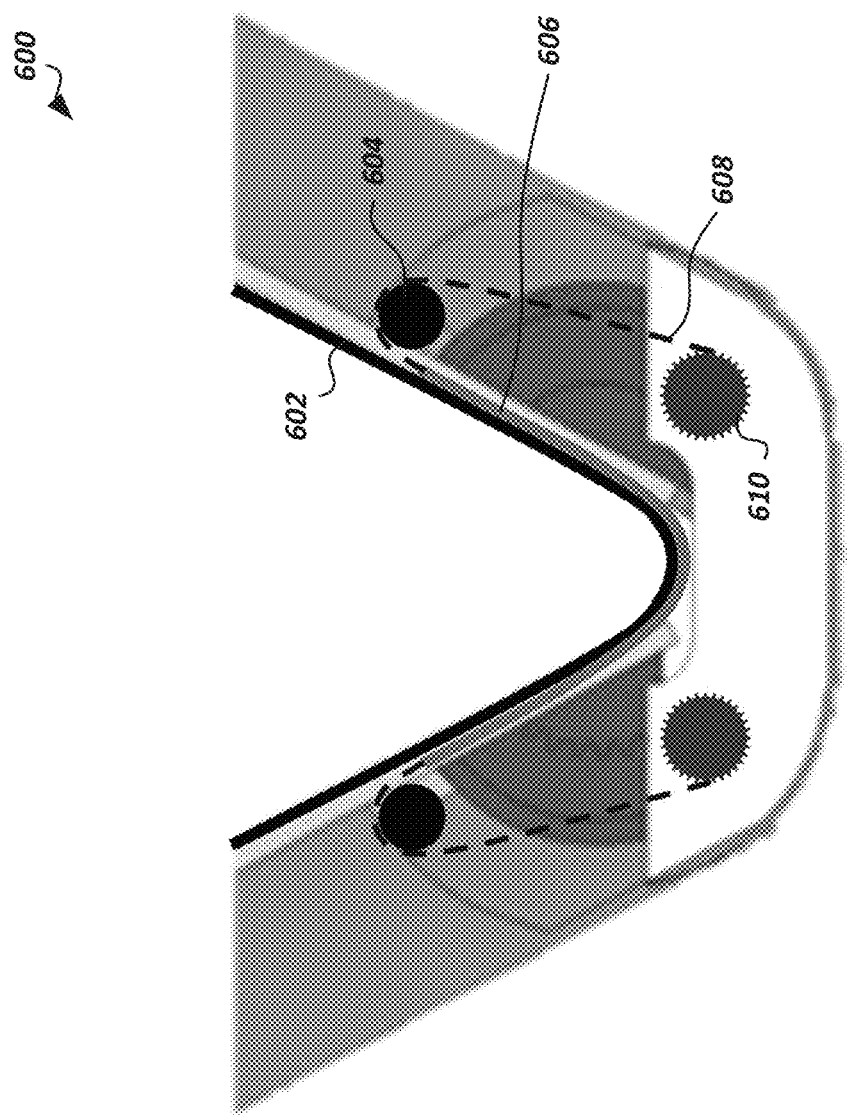
FIG. 6 illustrates a side view of another example foldable device that incorporates the hinge mechanism of FIGS. 2A-2B.

FIG. 6 illustrates a side view of another example foldable device 600 that incorporates the hinge mechanism 200 of FIGS. 2A-2B. In the example shown, the device 600 includes a display support system, which may be beneficial for devices having a larger bend radius. The display support system may support the flexible display 602 of the device while the device is in a bent state (e.g., when interaction is necessary with the display 602 in a laptop mode) and includes, for each wing of the device 600, a pulley 604, support plate 606 (e.g., sheet metal (e.g., 0.1 mm Titanium sheet) or another suitable material), and connector 608 (e.g., string or another suitable connection mechanism) that couples the support plate 606 to the curved rack apparatus 610. In this example configuration, the amount of rotation of the curved rack apparatus 610 is directly linked to the angle of opening of the wings of the device 600. When the wings are opened, for instance, the curved rack apparatus 610 may drive its shaft gears, and the connector 608 attached to these shaft gears may pull the support plate 606 in/out (based on the direction of rotation). The support plate 606 may provide the flexible display 602 with necessary backing support in the area of curvature whenever the wings of the device are in an orientation less than 180 degrees, which may allow for touch or other types of interaction with the display 602 in such orientation without causing damage to the display 602.

Figure 7:
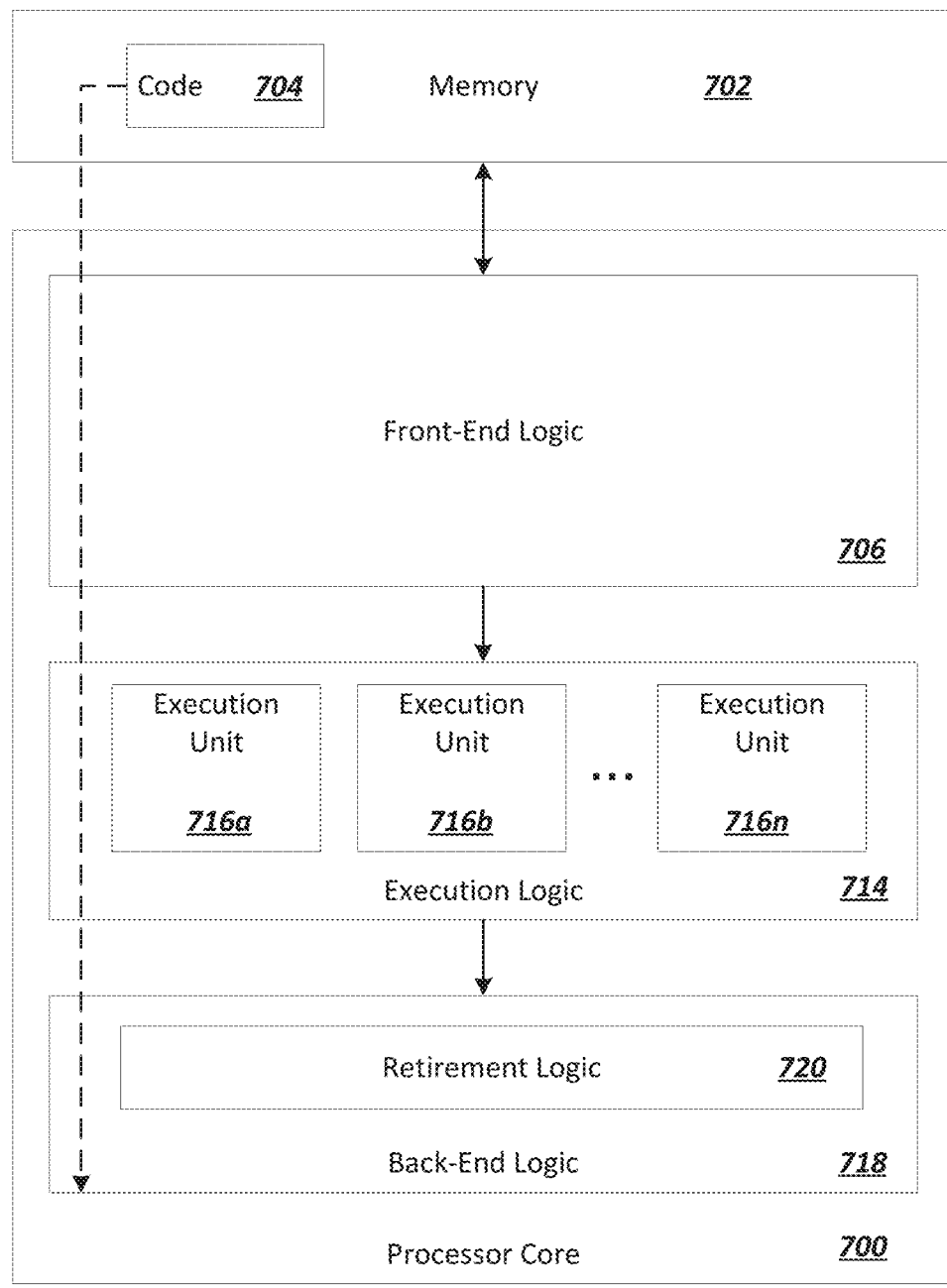
FIG. 7 is an example illustration of a processor according to an embodiment.
Figure 8:
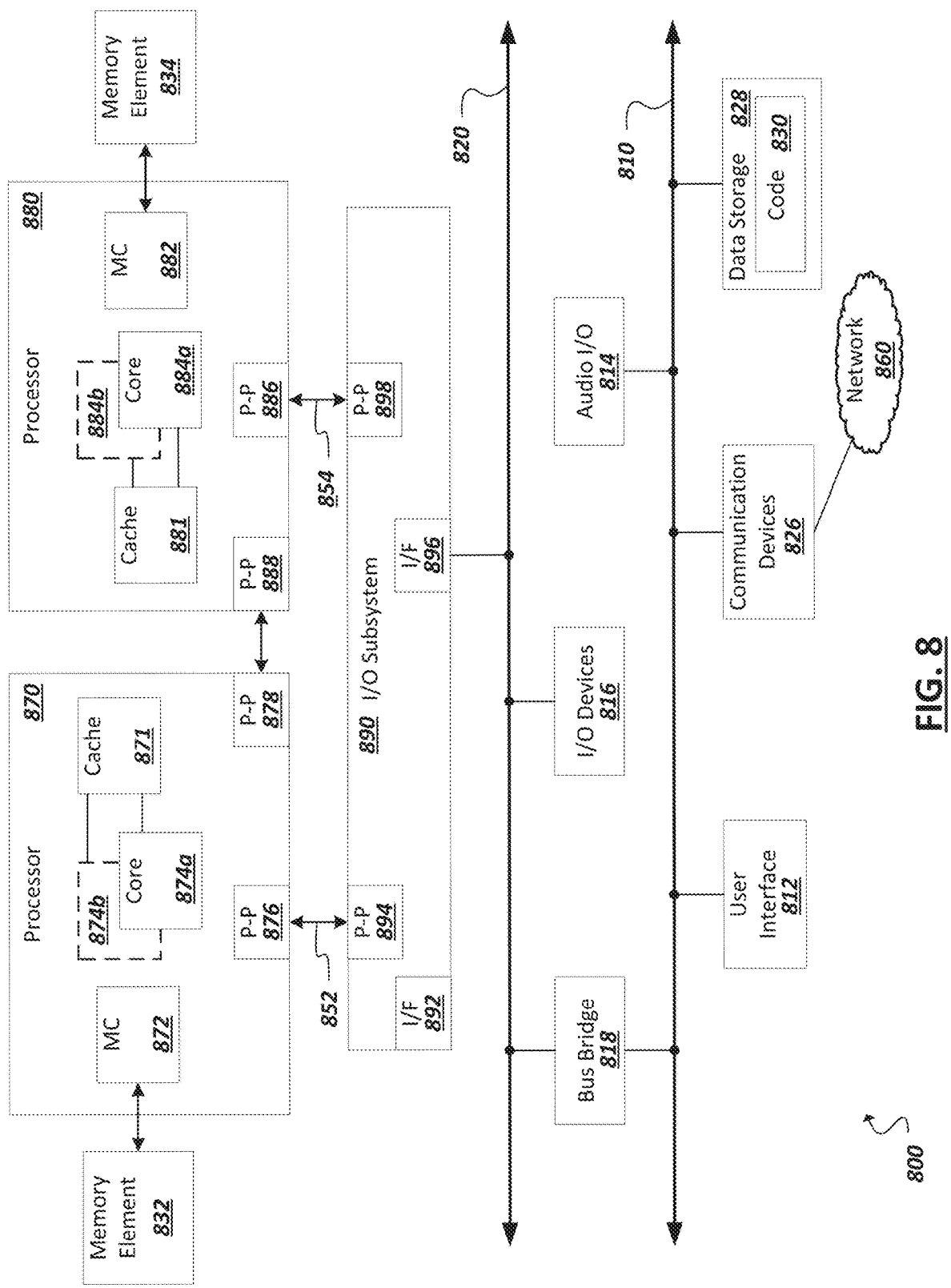
FIG. 8 illustrates a computing system that is arranged in a point-to-point (PtP) configuration according to an embodiment.

FIGS. 7-8 are block diagrams of example computer architectures that may be used in accordance with embodiments disclosed herein. For example, in some embodiments, a computing device containing one or more aspects shown in FIGS. 7-8 (e.g., the processor core 700 of FIG. 7 or one or both of processors 870, 880 of FIG. 8) may utilize a foldable device and a hinge mechanism as described herein. In some embodiments, the computer architecture may be implemented within a mobile computing system, such as a laptop or notebook computer, tablet device, or mobile phone/smartphone. Other computer architecture designs known in the art for processors and computing systems may also be used. Generally, suitable computer architectures for embodiments disclosed herein can include, but are not limited to, configurations illustrated in FIGS. 7-8.

FIG. 7 is an example illustration of a processor according to an embodiment. Processor 700 is an example of a type of hardware device that can be used in connection with the implementations above. Processor 700 may be any type of processor, such as a microprocessor, an embedded processor, a digital signal processor (DSP), a network processor, a multi-core processor, a single core processor, or other device to execute code. Although only one processor 700 is illustrated in FIG. 7, a processing element may alternatively include more than one of processor 700 illustrated in FIG. 7. Processor 700 may be a single-threaded core or, for at least one embodiment, the processor 700 may be multi-threaded in that it may include more than one hardware thread context (or "logical processor") per core.

FIG. 7 also illustrates a memory 702 coupled to processor 700 in accordance with an embodiment. Memory 702 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 700 can execute any type of instructions associated with algorithms, processes, or operations detailed herein. Generally, processor 700 can transform an element or an article (e.g., data) from one state or thing to another state or thing.

Code 704, which may be one or more instructions to be executed by processor 700, may be stored in memory 702, or may be stored in software, hardware, firmware, or any suitable combination thereof, or in any other internal or external component, device, element, or object where appropriate and based on particular needs. In one example, processor 700 can follow a program sequence of instructions indicated by code 704. Each instruction enters a front-end logic 706 and is processed by one or more decoders 708. The decoder may generate, as its output, a micro operation such as a fixed width micro operation in a predefined format, or may generate other instructions, microinstructions, or control signals that reflect the original code instruction. Front-end logic 706 also includes register renaming logic 710 and scheduling logic 712, which generally allocate resources and queue the operation corresponding to the instruction for execution.

Processor 700 can also include execution logic 714 having a set of execution units 716a, 716b, 716n, etc. Some embodiments may include a number of execution units dedicated to specific functions or sets of functions. Other embodiments may include only one execution unit or one execution unit that can perform a particular function. Execution logic 714 performs the operations specified by code instructions.

After completion of execution of the operations specified by the code instructions, back-end logic 718 can retire the instructions of code 704. In one embodiment, processor 700 allows out of order execution but requires in order retirement of instructions. Retirement logic 720 may take a variety of known forms (e.g., re-order buffers or the like). In this manner, processor 700 is transformed during execution of code 704, at least in terms of the output generated by the decoder, hardware registers and tables utilized by register renaming logic 710, and any registers (not shown) modified by execution logic 714.

Although not shown in FIG. 7, a processing element may include other elements on a chip with processor 700. For example, a processing element may include memory control logic along with processor 700. The processing element may include I/O control logic and/or may include I/O control logic integrated with memory control logic. The processing element may also include one or more caches. In some embodiments, non-volatile memory (such as flash memory or fuses) may also be included on the chip with processor 700.

FIG. 8 illustrates a computing system 800 that is arranged in a point-to-point (PtP) configuration according to an embodiment. In particular, FIG. 8 shows a system where processors, memory, and input/output devices are interconnected by a number of point-to-point interfaces. Generally, one or more of the computing systems described herein may be configured in the same or similar manner as computing system 700.

Processors 870 and 880 may also each include integrated memory controller logic (MC) 872 and 882 to communicate with memory elements 832 and 834. In alternative embodiments, memory controller logic 872 and 882 may be discrete logic separate from processors 870 and 880. Memory elements 832 and/or 834 may store various data to be used by processors 870 and 880 in achieving operations and functionality outlined herein.

Processors 870 and 880 may be any type of processor, such as those discussed in connection with other figures. Processors 870 and 880 may exchange data via a point-to-point (PtP) interface 850 using point-to-point interface circuits 878 and 888, respectively. Processors 870 and 880 may each exchange data with a chipset 890 via individual point-to-point interfaces 852 and 854 using point-to-point interface circuits 876, 886, 894, and 898. Chipset 890 may also exchange data with a co-processor 838, such as a high-performance graphics circuit, machine learning accelerator, or other co-processor 838, via an interface 839, which could be a PtP interface circuit. In alternative embodiments, any or all of the PtP links illustrated in FIG. 8 could be implemented as a multi-drop bus rather than a PtP link.

Chipset 890 may be in communication with a bus 820 via an interface circuit 896. Bus 820 may have one or more devices that communicate over it, such as a bus bridge 818 and I/O devices 816. Via a bus 810, bus bridge 818 may be in communication with other devices such as a user interface 812 (such as a keyboard, mouse, touchscreen, or other input devices), communication devices 826 (such as modems, network interface devices, or other types of communication devices that may communicate through a computer network 860), audio I/O devices 816, and/or a data storage device 828. Data storage device 828 may store code 830, which may be executed by processors 870 and/or 880. In alternative embodiments, any portions of the bus architectures could be implemented with one or more PtP links.

The computer system depicted in FIG. 8 is a schematic illustration of an embodiment of a computing system that may be utilized to implement various embodiments discussed herein. It will be appreciated that various components of the system depicted in FIG. 8 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

These and other embodiments can each optionally include one or more of the following features. The features identified for each of the functions can be combined to generate a consolidated string for the sample and the feature set can be generated from the consolidated string. A string can be generated for each of the functions, each string describing the respective features identified for the function. Combining the features can include identifying a call in a particular one of the plurality of functions to another one of the plurality of functions and replacing a portion of the string of the particular function referencing the other function with contents of the string of the other function. Identifying the features can include abstracting each of the strings of the functions such that only features of the set of control flow fragment types are described in the strings. The set of control flow fragment types can include memory accesses by the function and function calls by the function. Identifying the features can include identifying instances of memory accesses by each of the functions and identifying instances of function calls by each of the functions. The feature set can identify each of the features identified for each of the functions. The feature set can be an n-graph.

Further, these and other embodiments can each optionally include one or more of the following features. The feature set can be provided for use in classifying the sample. For instance, classifying the sample can include clustering the sample with other samples based on corresponding features of the samples. Classifying the sample can further include determining a set of features relevant to a cluster of samples. Classifying the sample can also include determining whether to classify the sample as malware and/or determining whether the sample is likely one of one or more families of malware. Identifying the features can include abstracting each of the control flow graphs such that only features of the set of control flow fragment types are described in the control flow graphs. A plurality of samples can be received, including the sample. In some cases, the plurality of samples can be received from a plurality of sources. The feature set can identify a subset of features identified in the control flow graphs of the functions of the sample. The subset of features can correspond to memory accesses and function calls in the sample code.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. It will be understood that certain examples may be combined with certain other examples, in certain embodiments.

Example 1 includes a hinge apparatus comprising: first and second curved rack apparatuses, each curved rack apparatus defining an arcuate surface and an arcuate set of gear teeth concentric with the arcuate surface, the radius of curvature of the arcuate set of gear teeth being non-uniform; and a gear assembly comprising: a first gear; a second gear; a third gear coupling the first and second gears; a fourth gear coupling the first gear and the arcuate set of gear teeth of the first curved rack apparatus; and a fifth gear coupling the second gear and the arcuate set of gear teeth of the second curved rack apparatus.

Example 2 includes the subject matter of Example 1 and/or other Example(s), and optionally, further comprising a housing defining a set of cavities, wherein the first curved rack apparatus is disposed in a first cavity of the housing such that the arcuate surface of the first curved rack apparatus interfaces with an inner surface of the first cavity, the second curved rack apparatus is disposed in a second cavity of the housing such that the arcuate surface of the second curved rack apparatus interfaces with an inner surface of the second cavity, and the gear assembly is disposed in a third cavity of the housing.

Example 3 includes the subject matter of Example 2 and/or other Example(s), and optionally, wherein the first cavity is defined proximate to a first end of the housing, the second cavity is disposed proximate to a second end of the housing opposite the first end, and the third cavity is disposed between the first and second cavities.

Example 4 includes the subject matter of any one of Examples 1-3 and/or other Example(s), and optionally, wherein the first, second, and third gears are helical gears, and the fourth and fifth gears are spur gears.

Example 5 includes the subject matter of Example 4 and/or other Example(s), and optionally, wherein the third gear has a lower helix angle than the first and second gears.

Example 6 includes the subject matter of any one of Examples 1-5 and/or other Example(s), and optionally, wherein the first and second gears are parallel with respect to one another.

Example 7 includes an apparatus comprising: a first substantially flat display support; a second substantially flat display support; a spine coupling the first and second display supports, the spine comprising at least one hinge assembly comprising: first and second curved rack apparatuses, each curved rack apparatus defining an arcuate surface and an arcuate set of gear teeth concentric with the arcuate surface, the radius of curvature of the arcuate set of gear teeth being non-uniform; a gear assembly comprising: a first helical gear; a second helical gear; a third helical gear coupling the first and second helical gears; a first spur gear coupling the first helical gear and the arcuate set of gear teeth of the first curved rack apparatus; and a second spur gear coupling the second helical gear and the arcuate set of gear teeth of the second curved rack apparatus.

Example 8 includes the subject matter of Example 7 and/or other Example(s), and optionally, further comprising a first low surface energy material disposed on a surface of the first display support opposite a surface of the first display support to which the first curved rack apparatus is coupled, and a second low surface energy material disposed on a surface of the second display support opposite a surface of the second display support to which the second curved rack apparatus is coupled.

Example 9 includes the subject matter of Example 8 and/or other Example(s), and optionally, wherein the low surface energy materials are polyethylene terephthalate (PET).

Example 10 includes the subject matter of any one of Examples 7-9 and/or other Example(s), and optionally, further comprising: a first pulley coupled to the first curved rack apparatus via a first connector such that the first pulley is to rotate in coordination with the first curved rack apparatus; a second pulley coupled to the second curved rack apparatus via a second connector such that the second pulley is to rotate in coordination with the second curved rack apparatus; and a support plate coupled to the first connector and the second connector.

Example 11 includes the subject matter of Example 10 and/or other Example(s), and optionally, wherein the first and second connectors are strings.

Example 12 includes the subject matter of any one of Examples 7-11 and/or other Example(s), and optionally, further comprising a first device housing coupled to the first display support and a second device housing coupled to the second display support.

Example 13 includes the subject matter of Example 12 and/or other Example(s), and optionally, further comprising a first diaphragm material disposed between the first curved rack apparatus and the first device housing, and a second diaphragm material disposed between the second curved rack apparatus and the second device housing.

Example 14 includes the subject matter of Example 13 and/or other Example(s), and optionally, wherein the first and second diaphragm materials are Teflon-coated rubber.

Example 15 includes a system comprising: a processor; memory; a first device housing; a second device housing; a first display support coupled to the first device housing; a second display support coupled to the first device housing; a spine coupling the first and second display supports, wherein the spine comprises a hinge assembly comprising: first and second curved rack apparatuses, each curved rack apparatus defining an arcuate surface and an arcuate set of gear teeth concentric with the arcuate surface, the radius of curvature of the arcuate set of gear teeth being non-uniform; a gear assembly comprising: a first helical gear; a second helical gear; a third helical gear coupling the first and second helical gears; a first spur gear coupling the first helical gear and the arcuate set of gear teeth of the first curved rack apparatus; and a second spur gear coupling the second helical gear and the arcuate set of gear teeth of the second curved rack apparatus; and a flexible display coupled to the first and second display supports.

Example 16 includes the subject matter of Example 15 and/or other Example(s), and optionally, wherein the curvature of the arcuate surfaces of the first and second curved rack apparatuses is defined such that an arc length of the flexible display remains constant as the curved rack apparatuses are rotated.

Example 17 includes the subject matter of any one of Examples 15-16 and/or other Example(s), and optionally, further comprising a first low surface energy material disposed on a surface of the first display support opposite a surface of the first display support to which the first curved rack apparatus is coupled, and a second low surface energy material disposed on a surface of the second display support opposite a surface of the second display support to which the second curved rack apparatus is coupled.

Example 18 includes the subject matter of any one of Examples 15-17 and/or other Example(s), and optionally, further comprising further comprising a first diaphragm material disposed between the first curved rack apparatus and the first device housing, and a second diaphragm material disposed between the second curved rack apparatus and the second device housing.

Example 19 includes the subject matter of any one of Examples 15-18 and/or other Example(s), and optionally, further comprising further comprising: a first pulley coupled to the first curved rack apparatus via a first connector such that the first pulley is to rotate in coordination with the first curved rack apparatus; a second pulley coupled to the second curved rack apparatus via a second connector such that the second pulley is to rotate in coordination with the second curved rack apparatus; and a support plate coupled to the first connector and the second connector, the support plate disposed between the flexible display and the first and second display supports.

Example 20 includes the subject matter of any one of Examples 15-19 and/or other Example(s), and optionally, wherein the system is one of a laptop computer, tablet computer, and mobile phone.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A hinge apparatus comprising:
   first and second curved rack apparatuses, each curved rack apparatus defining an arcuate surface and an arcuate set of gear teeth concentric with the arcuate surface, the radius of curvature of the arcuate set of gear teeth being non-uniform; and
   a gear assembly comprising:
   a first gear;
   a second gear;
   a third gear coupling the first and second gears;
   a fourth gear coupling the first gear and the arcuate set of gear teeth of the first curved rack apparatus; and
   a fifth gear coupling the second gear and the arcuate set of gear teeth of the second curved rack apparatus.

2. The apparatus of claim 1, further comprising a housing defining a set of cavities, wherein the first curved rack apparatus is disposed in a first cavity of the housing such that the arcuate surface of the first curved rack apparatus interfaces with an inner surface of the first cavity, the second curved rack apparatus is disposed in a second cavity of the housing such that the arcuate surface of the second curved rack apparatus interfaces with an inner surface of the second cavity, and the gear assembly is disposed in a third cavity of the housing.

3. The apparatus of claim 2, wherein the first cavity is defined proximate to a first end of the housing, the second cavity is disposed proximate to a second end of the housing opposite the first end, and the third cavity is disposed between the first and second cavities.

4. The apparatus of claim 1, wherein the first, second, and third gears are helical gears, and the fourth and fifth gears are spur gears.

5. The apparatus of claim 4, wherein the third gear has a lower helix angle than the first and second gears.

6. The apparatus of claim 1, wherein the first and second gears are parallel with respect to one another.

7. An apparatus comprising:
   a first substantially flat display support;
   a second substantially flat display support;
   a spine coupling the first and second display supports, the spine comprising at least one hinge assembly comprising:
   first and second curved rack apparatuses, each curved rack apparatus defining an arcuate surface and an arcuate set of gear teeth concentric with the arcuate surface, the radius of curvature of the arcuate set of gear teeth being non-uniform;
   a gear assembly comprising:
   a first helical gear;
   a second helical gear;
   a third helical gear coupling the first and second helical gears;
   a first spur gear coupling the first helical gear and the arcuate set of gear teeth of the first curved rack apparatus; and
   a second spur gear coupling the second helical gear and the arcuate set of gear teeth of the second curved rack apparatus.

8. The apparatus of claim 7, further comprising a first low surface energy material disposed on a surface of the first display support opposite a surface of the first display support to which the first curved rack apparatus is coupled, and a second low surface energy material disposed on a surface of the second display support opposite a surface of the second display support to which the second curved rack apparatus is coupled.

9. The apparatus of claim 8, wherein the low surface energy materials are polyethylene terephthalate (PET).

10. The apparatus of claim 7, further comprising:
    a first pulley coupled to the first curved rack apparatus via a first connector such that the first pulley is to rotate in coordination with the first curved rack apparatus;
    a second pulley coupled to the second curved rack apparatus via a second connector such that the second pulley is to rotate in coordination with the second curved rack apparatus; and
    a support plate coupled to the first connector and the second connector.

11. The apparatus of claim 10, wherein the first and second connectors are strings.

12. The apparatus of claim 7, further comprising a first device housing coupled to the first display support and a second device housing coupled to the second display support.

13. The apparatus of claim 12, further comprising a first diaphragm material disposed between the first curved rack apparatus and the first device housing, and a second diaphragm material disposed between the second curved rack apparatus and the second device housing.

14. The apparatus of claim 13, wherein the first and second diaphragm materials are Teflon-coated rubber.

15. A system comprising:
    a processor;
    memory;
    a first device housing;
    a second device housing;
    a first display support coupled to the first device housing;
    a second display support coupled to the first device housing;

a spine coupling the first and second display supports, wherein the spine comprises a hinge assembly comprising:
  first and second curved rack apparatuses, each curved rack apparatus defining an arcuate surface and an arcuate set of gear teeth concentric with the arcuate surface, the radius of curvature of the arcuate set of gear teeth being non-uniform;
  a gear assembly comprising:
    a first helical gear;
    a second helical gear;
    a third helical gear coupling the first and second helical gears;
    a first spur gear coupling the first helical gear and the arcuate set of gear teeth of the first curved rack apparatus; and
    a second spur gear coupling the second helical gear and the arcuate set of gear teeth of the second curved rack apparatus; and
  a flexible display coupled to the first and second display supports.

16. The system of claim 15, wherein the curvature of the arcuate surfaces of the first and second curved rack apparatuses is defined such that an arc length of the flexible display remains constant as the curved rack apparatuses are rotated.

17. The system of claim 15, further comprising a first low surface energy material disposed on a surface of the first display support opposite a surface of the first display support to which the first curved rack apparatus is coupled, and a second low surface energy material disposed on a surface of the second display support opposite a surface of the second display support to which the second curved rack apparatus is coupled.

18. The system of claim 15, further comprising further comprising a first diaphragm material disposed between the first curved rack apparatus and the first device housing, and a second diaphragm material disposed between the second curved rack apparatus and the second device housing.

19. The system of claim 15, further comprising further comprising:
  a first pulley coupled to the first curved rack apparatus via a first connector such that the first pulley is to rotate in coordination with the first curved rack apparatus;
  a second pulley coupled to the second curved rack apparatus via a second connector such that the second pulley is to rotate in coordination with the second curved rack apparatus; and
  a support plate coupled to the first connector and the second connector, the support plate disposed between the flexible display and the first and second display supports.

20. The system of claim 15, wherein the system is one of a laptop computer, tablet computer, and mobile phone.

* * * * *